United States Patent
Byron et al.

[11] Patent Number: 5,844,926
[45] Date of Patent: Dec. 1, 1998

[54] LASERS

[75] Inventors: Kevin Christopher Byron, Herts; Kate Sugden, Birmingham, both of United Kingdom

[73] Assignee: Northern Telecom Limited, Montreal, Canada

[21] Appl. No.: 793,733
[22] PCT Filed: Jun. 13, 1996
[86] PCT No.: PCT/GB96/01406
  § 371 Date: Jul. 10, 1997
  § 102(e) Date: Jul. 10, 1997
[87] PCT Pub. No.: WO97/01201
  PCT Pub. Date: Jan. 9, 1997

[30] Foreign Application Priority Data

Jun. 21, 1995 [GB] United Kingdom ............... 9512607

[51] Int. Cl.⁶ .................. H01S 3/30; G02B 6/34
[52] U.S. Cl. ........................ 372/6; 372/9; 372/23; 372/92; 372/102; 385/37
[58] Field of Search .................. 372/6, 9, 23, 69, 372/70, 92, 98, 102; 385/37, 123, 42

[56] References Cited

U.S. PATENT DOCUMENTS

| | | | |
|---|---|---|---|
| 4,831,631 | 5/1989 | Haeussler et al. | 372/92 |
| 5,048,909 | 9/1991 | Henry et al. | 385/27 |
| 5,237,576 | 8/1993 | DiGiovanni et al. | 372/6 |
| 5,475,780 | 12/1995 | Mizrahi | 385/37 |
| 5,633,965 | 5/1997 | Bricheno et al. | 385/37 |
| 5,638,473 | 6/1997 | Byron | 385/37 |

FOREIGN PATENT DOCUMENTS

| | | | |
|---|---|---|---|
| 0 524 558 A2 | 7/1992 | European Pat. Off. | 372/6 |
| 2 402 320A | 9/1977 | France | 372/6 |

OTHER PUBLICATIONS

Tkack, "Regimes of Feedback Effects in 1.5 um Distributed Feedback Lasers", Journal of Lightwave Technology, vol. LT–4, No. 11, Nov. 1986, pp. 1655–1661.

INSPEC Abstract Accession No. A9518–4260B–003 & Proceedings of CLEO 1994. vol. 8. 1994 Technical Digest Series, pp. 349–350. Kodama et al. Novel $CO_2$/laser with Michelson–interferometer type optical resonator.

IEEE Photonics Technology Letters, vol. 6 No. 1 Jan 1994 pp. 80–82 — Bilodeau et al: High Return–Loss Narrowband All–Fiber Bandpass Bragg Transmission Filter.

Applied Physics Letters, vol. 64, No. 20 May 16 1994, pp. 2634–2636 — Morton et al "Stable Single Mode Hybrid Laser with High Power and Narrow Linewidth".

Primary Examiner—Brian Healy
Attorney, Agent, or Firm—Lee, Mann, Smith, McWilliams, Sweeney, Ohlson

[57] ABSTRACT

A laser has an optical laser cavity one end of which is constituted by a partial reflector formed in optical waveguide by an unbalanced Michelson interferometer comprising an optical waveguide splitter/combiner (23; 33) and two optical waveguide Bragg grating reflectors (24a, 24b; 34a, 34b; 44a, 44b).

5 Claims, 2 Drawing Sheets

LASERS

BACKGROUND OF THE INVENTION

This invention relates to lasers, and in particular to a class of laser having an optical laser cavity one end of which is formed in optical waveguide, typically optical fibre waveguide. One example of such a laser is an optically pumped erbium doped optical fibre laser provided with optical fibre Bragg grating reflectors to define the ends of its optical cavity. Another example, depicted in FIG. 1, is constituted by a semiconductor injection laser diode chip 10 provided with an anti-reflection coating 11 on one end facet 12 to which is optically coupled a length of optical fibre pigtail 13 in which there is a Bragg grating reflector 14 defining one end of a laser optical cavity whose other end is provided by the end facet 15 of the injection laser chip remote from the anti-reflection coated end facet. Interest in such diode lasers, known as external cavity diode lasers arises at least in part to the fact the Bragg grating reflector provides a means of locking the laser frequency.

SUMMARY OF THE INVENTION

The present invention is directed to a modified configuration of reflector which can be employed to provide improved laser performance by removal of out-of-band spontaneous emission from the output of laser or by enhanced inhibition of mode hopping.

According to the present invention there is provided a laser having an optical laser cavity one end of which is constituted by a partial reflector formed in optical waveguide by an unbalanced Michelson interferometer comprising an optical waveguide splitter/combiner and two optical waveguide Bragg grating reflectors.

An additional advantageous feature of this arrangement is that the reflectivity of the partial reflector can be readily trimmed for optimum power output of the laser by using the photo-refractive effect to alter the optical path length of one of the interference arms of the Michelson.

BRIEF DESCRIPTION OF THE DRAWINGS

There follows a description of lasers embodying the invention in preferred forms.

DETAILED DESCRIPTION OF THE DRAWINGS

Figure 1:
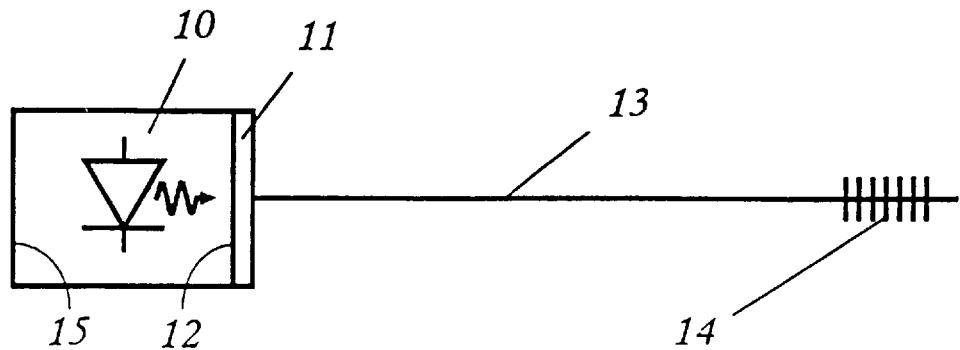
FIG. 1 (to which previous reference has already been made) schematically depicts a prior art external cavity diode laser, and FIGS. 2, 3 and 4 schematically depict external cavity diode lasers with alternative forms of imbalance Michelson interferometer type external Bragg grating type reflector.
Figure 2:
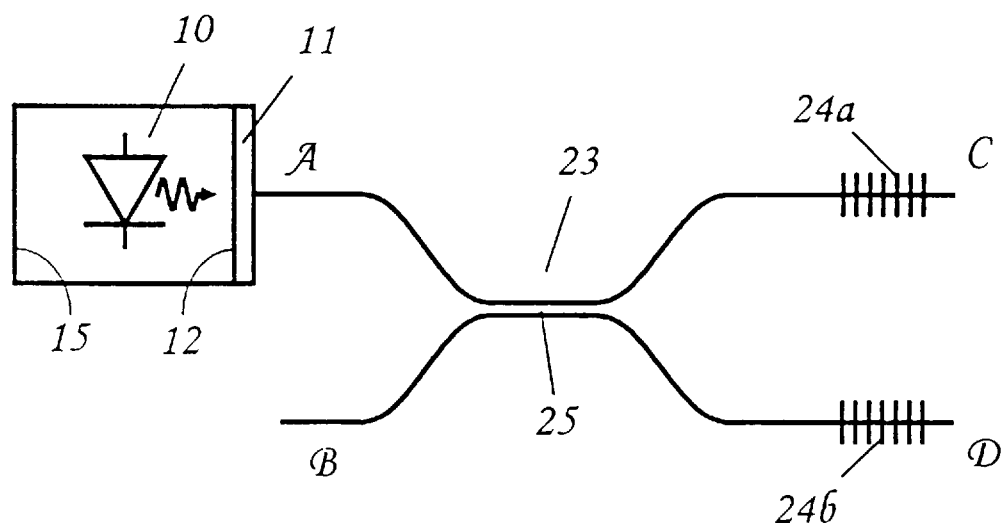
Figure 3:
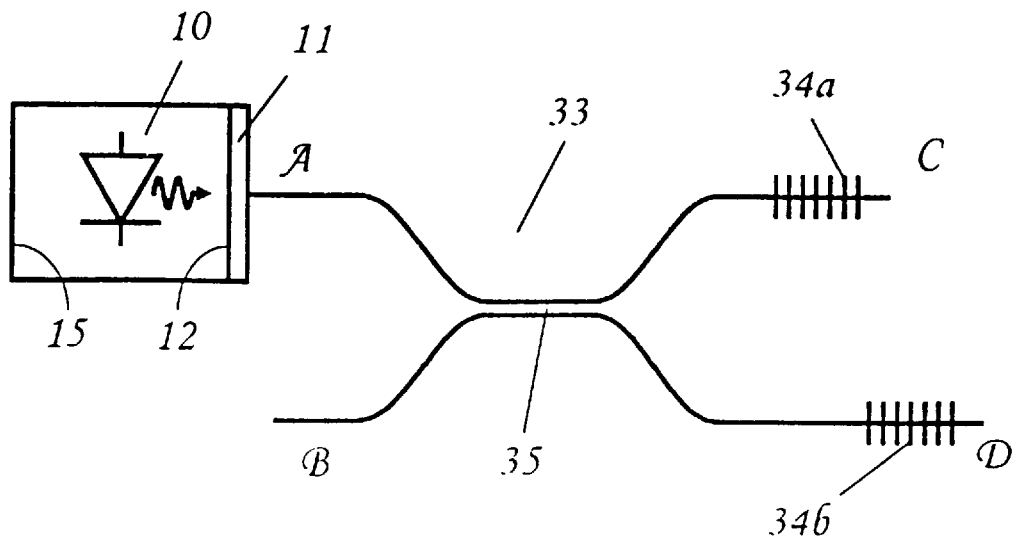
Figure 4:
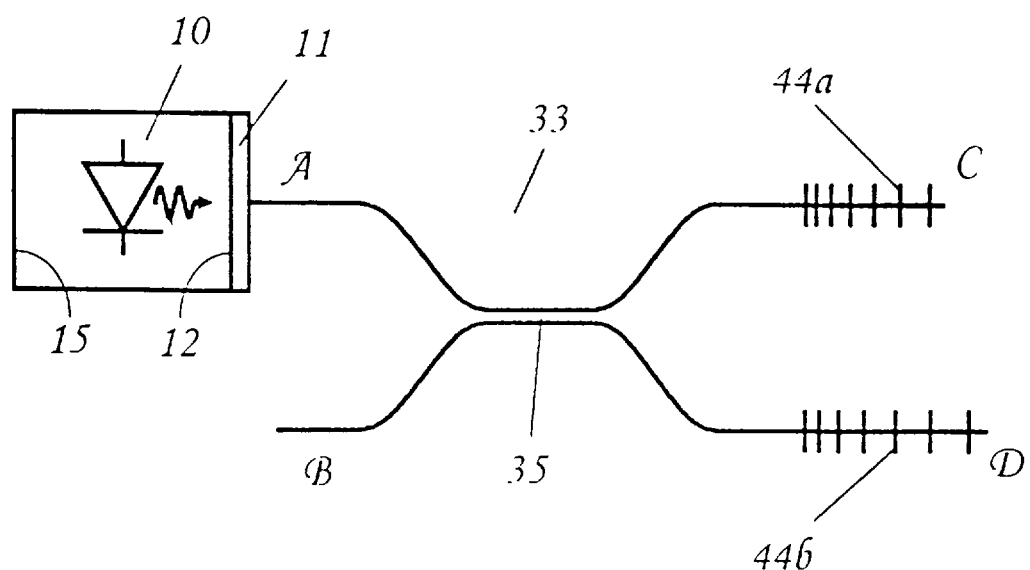

The lasers of FIGS. 2, 3 and 4 have the same semiconductor laser chip components as the laser of FIG. 1, and so these components have been identified in these Figures using the same index numerals as those employed in FIG. 1. In each instance the place of the fibre pigtail 13 and single Bragg grating reflector 14 has been taken by an unbalanced Michelson interferometer. In the case of the laser of FIG. 2, this unbalanced Michelson interferometer has matched Bragg grating reflectors 24a and 24b located equidistant from the coupling region 25 of a 2×2 waveguide splitter/combiner 23 having ports, A, B, C and D. Port A is optically coupled with the anti-reflection coated facet 12 of the diode chip 10. The two Bragg grating reflectors 24a and 24b are respectively formed in the two arms of the splitter/combiner that respectively terminate in ports C and D. Port B constitutes the optical output of the laser.

If the splitter combiner 23 were to have been a balanced 3 dB splitter/combiner, then light launched into the splitter/combiner by way of port A would have been divided by its coupling region 25 equally between the two limbs terminating in ports C and D. Light within the wavebands of Bragg grating reflectors 24a and 24b would be reflected back to the coupling region 25 where, because of the equidistance of the reflectors 24a and 24b from the coupling region, all this light would emerge from the splitter/combiner by way of port 8. This means that this (balanced) Michelson interferometer would fail to provide any feedback, and so would not function as one of the end of a laser optical cavity. Thus a laser would not be formed. It is for this reason that some form of imbalance in the Michelson interferometer is required.

In the case of the laser of FIG. 2 this imbalance is provided by making the splitter/combiner deliberately unbalanced, directing more of the optical power launched into it by way of port A into one of the two arms respectively terminating in ports C and D than into the other. This means that the amplitude of the light reflected by Bragg grating coupler 24a back into the coupling region 25 is not equal to that reflected back into it by Bragg grating coupler 24b. In consequence some of the reflected light emerges from this splitter/combiner by way of port A and hence provides the feedback necessary for laser action. Typically the feedback may be about 10%, leaving about 90% to emerge from port B, which constitutes the output port of the laser.

One feature to be particularly noted contrasting the laser of FIG. 2 from that of FIG. 1 is that spontaneous emission launched into the splitter/combiner from the diode chip 10 is, with the exception of that lying within the reflection band of the Bragg grating reflectors 24a and 24b, separated from the laser output to emerge from ports C and D rather than the laser output port B. No such separation occurs in the case of the laser of FIG. 1. Typically the Bragg grating reflectors are created in photosensitive optical waveguide, in which case the Q of the laser cavity can be adjusted by using UV light to trim one of the arms of the Michelson interferometer to add to its unbalance.

An alternative form of Michelson interferometer imbalance is employed in the laser of FIG. 3. Like the laser of FIG. 2, this laser has one end of its laser optical cavity formed by an unbalanced Michelson interferometer comprising a waveguide splitter/combiner 33 and two optical waveguide Bragg grating reflectors 34a and 34b. The reflectors 34a and 34b are identical with reflectors 24a and 24b of the laser of FIG. 2, but are located at different distances from the coupling region 35 of splitter/combiner 33. Splitter/combiner 33 is distinguished from splitter/combiner 23 of FIG. 2 in that splitter/combiner 33 is a balanced 3 dB splitter/combiner.

A prior art method of adjusting the Q of an external cavity diode laser so as to optimise its output has involved replacing its external mirror with a different mirror of a different reflectivity. Such an approach is costly in both time and resources and is limited by the step sizes between the reflectivities of the mirrors used. With the laser configuration of FIG. 3, by making use of the photosensitivity of waveguides, the Q is much more readily adjusted, and moreover, such adjustment can be achieved during operation of the laser. Such adjustment may be performed by irradiating with UV light one of the waveguides in a region between its Bragg grating and the coupling region of the splitter/combiner. Such irradiation is employed to alter the effective refractive index of the waveguide in that region, and hence the optical path length of that arm of the Michelson interferometer, thereby changing the reflectivity presented to the diode chip by the interferometer.

In the case of the laser of FIG. 3 it is expected that the unequal distances of the two grating reflectors from the coupling region 35 can be arranged to provide a measure of inhibition of mode-hopping. With the appropriate relative displacement, when the laser is in stable operation, the unbalanced Michelson interferometer functions to light within the laser cavity as a stable low reflectivity reflector. If there is a tendency to mode hop such mode hopping would produced a reflectivity change since the phase upon reflection from the gratings is changed, and therefore the condition of interference back at the coupler changes. This reflectivity change is sensed at the laser diode chip 10, changing the carrier density and thus its effective refractive index and effective optical path length so as to bring the laser emission back to its original wavelength. Like the laser of FIG. 2, this laser separates out-of-band spontaneous emission noise from the output of the laser printed at port A.

A variant of the laser of FIG. 3 is depicted in FIG. 4. This uses the same splitter/combiner 33 as the laser of FIG. 3 but, instead of having displaced but otherwise matching Bragg grating reflectors 34a and 34b, provides imbalance by the use of dissimilar chirped Bragg grating reflectors 44a and 44b. These are of different length and are chirped at different rates in such a way as to provide the same bandwidth for each grating. When there is a change of effective optical path distance between the reflecting facet 15 of the laser diode chip 10 and the coupling region 35 of splitter/combiner 33 that tends to promote a change of emission frequency, then the reflection point in the longer grating will tend to move further than that in the shorter grating thereby providing a compensating phase shift.

We claim:

1. A laser having an optical laser cavity extending between first and second reflecting optical laser cavity ends, and having extending between said reflecting ends a substantially non-reflecting transmission path, wherein said first end is constituted by a partial reflector formed in optical waveguide by an unbalanced Michelson interferometer comprising an optical waveguide splitter/combiner and two optical waveguide Bragg grating reflectors, and wherein optical gain in the laser is provided by a length of optically amplifying waveguide.

2. A laser as claimed in claim 1, wherein the optical waveguide Bragg grating reflectors are optical fibre optical waveguide reflectors.

3. A laser as claimed in claim 2, wherein the optical waveguide spitter/combiner is an optical fibre optical waveguide splitter/combiner.

4. A laser having an optical laser cavity extending between first and second reflecting optical laser cavity ends, and having extending between said reflecting ends a substantially non-reflecting transmission path, wherein said first end is constituted by a partial reflector formed in optical waveguide by an unbalanced Michelson interferometer comprising an optical waveguide splitter/combiner and two optical waveguide Bragg grating reflectors, and wherein the optical waveguide Bragg grating reflectors are chirped gratings of different rates of chirp but the same bandwidth.

5. A laser as claimed in claim 4, wherein optical gain in the laser is provided by a diode laser chip.

* * * * *